US011198165B2

(12) United States Patent
Kisic et al.

(10) Patent No.: US 11,198,165 B2
(45) Date of Patent: Dec. 14, 2021

(54) PIN REFORMING TOOL

(71) Applicant: Westinghouse Electric Company LLC, Cranberry Township, PA (US)

(72) Inventors: James A. Kisic, Pittsburgh, PA (US); Samuel C. McCaslin, Pittsburgh, PA (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 177 days.

(21) Appl. No.: 16/299,613

(22) Filed: Mar. 12, 2019

(65) Prior Publication Data

US 2019/0283098 A1 Sep. 19, 2019

Related U.S. Application Data

(60) Provisional application No. 62/642,181, filed on Mar. 13, 2018.

(51) Int. Cl.
*B21D 3/00* (2006.01)
*H05K 3/22* (2006.01)

(52) U.S. Cl.
CPC ............... *B21D 3/00* (2013.01); *H05K 3/225* (2013.01)

(58) Field of Classification Search
CPC .......... B21D 3/00; B21D 3/14; B21D 39/025; H01R 43/22; H01R 43/0422; H01R 43/055; H01R 43/00; H05K 3/225; H05K 13/0813; B25B 27/0092; B25B 5/166; B25B 27/0078; B25B 27/0085; B25B 23/142; B25B 13/142; B23Q 3/183; B21F 1/02
USPC ................ 72/479, 21.4; 29/825; 279/18, 35; 140/147
See application file for complete search history.

(56) References Cited

U.S. PATENT DOCUMENTS 3,100,931 A * 8/1963 La Mar .................. H01R 43/22 29/764
5,509,192 A 4/1996 Ota et al.
7,121,165 B2 * 10/2006 Yamakawa ............. G04D 1/10 81/6
8,146,241 B1 * 4/2012 Thompson, Sr. ...... H01R 43/22 29/739
(Continued)

FOREIGN PATENT DOCUMENTS

CN 103875133 A 6/2014
JP 2005512812 A 5/2005

OTHER PUBLICATIONS

International Searching Authority, International Search Report and the Written Opinion for International Application No. PCT/US2019/021764, dated Jun. 28, 2019.

*Primary Examiner* — Edward T Tolan
*Assistant Examiner* — Katie L. Parr
(74) *Attorney, Agent, or Firm* — K&L Gates LLP

(57) ABSTRACT

A tool for reforming printed circuit board backplane connector pins on a rod control system. The pin reforming tool of this invention is aligned into a card cage using existing card guides and locates itself around the backplane connector. The tool uses a uniquely designed die (that can be set up for one or multiple pin applications) that precisely engages into the connector and around the pin or pins to be reformed, with the assistance of a zig zag alignment guide matched specifically for the pin spacing. A consistent reforming force is applied via a force applicator structured to provide a force of a preselected magnitude.

13 Claims, 5 Drawing Sheets

(56) References Cited

U.S. PATENT DOCUMENTS

| | | | | |
|---|---|---|---|---|
| 2005/0016769 | A1 | 1/2005 | Wallace | |
| 2012/0024117 | A1* | 2/2012 | Kreutzer | B25B 21/023<br>81/463 |
| 2015/0340803 | A1 | 11/2015 | Li et al. | |

* cited by examiner

PIN REFORMING TOOL

CROSS REFERENCE TO RELATED APPLICATION

This application is based on and claims priority to U.S. Provisional Patent Application No. 62/642,181, filed Mar. 13, 2018, entitled PIN REFORMING TOOL, the contents of which are incorporated herein by reference.

BACKGROUND

1. Field

This invention relates generally to electrical pin connectors and, more specifically, to a tool for reforming electrical pin connectors to their original specifications.

2. Related Art

Many nuclear plants have been dealing with control rod system faults that appear to be related to intermittent printed circuit board connections (possibly due to spread pins on the backplane connector) in the rod control system. A connector pin resembles a "tuning fork" and can easily become spread beyond a desired acceptable gap. Currently there is no convenient tool available for reforming the pins on the connector to their original specifications. Those that are trying to reform these pins are presently using a jeweler's screwdriver wedged into the connector or are using a filed down pair of pliers making this a very uncontrolled process. A four loop plant can have up to 6,100 pins in need of reforming. Accordingly, a more disciplined process for reforming the pins is desired that can preferably reform more than one pin at a time.

SUMMARY

These and other objects are achieved, in accordance with this invention, by an electrical connector pin reforming tool comprising a reforming die assembly that includes a pin reforming die configured to at least partially engage a pin of an electrical connector and substantially reform the pin to the original specifications; and a force applicator that is connected to the pin reforming die and is structured to transfer a preselected force to the pin reforming die. Preferably, the pin reforming die is structured to engage opposite sides of the pin. The tool further includes an extension rod connected at one end to the reforming die assembly below the force applicator, with the extension rod extending a distance below the force applicator to a location just above a tool housing. The tool housing surrounds the reforming die assembly and a lower portion of the extension rod, which is accessible to an operator of the tool. An automatic center punch is connected to an upper portion of the extension rod and is configured to transmit the preselected force to the force applicator through the extension rod.

In one embodiment, the pin reforming tool can engage one or a multiple of pins at one time. Preferably, the preselected force transmitted by the automatic center punch is adjustable and in one such embodiment the preselected force is locked down with a set screw on the center punch.

In another embodiment, the pin reforming die assembly, the extension rod and the automatic center punch, are moved from one pin or group of pins to another pin or group of pins by movement of a spring-loaded slide block that slides along an upper portion of the tool housing. Preferably, the spring-loaded slide block includes a means for aligning the pin reforming die over the pin or pins to be reformed. In one such embodiment the means for aligning the pin reforming die comprises a wavy upper surface on the upper portion of the tool housing that matches a wavy underside surface on the spring-loaded slide block. The means for aligning the pin reforming die may further comprise a wavy underside of a die housing positioned about the pin reforming die that matches a wavy upper surface on a lower portion of the tool housing.

Preferably, the tool housing is, at least in part, constructed from a substantially clear material such as a polycarbonate that will enable viewing of the process during operation. In still another embodiment the pin reforming die and the spring-loaded slide block include an interchangeable offset to align the pin reforming die with even row or odd row pins of the electrical connector.

BRIEF DESCRIPTION OF THE DRAWINGS

A further understanding of the invention can be gained from the following description of the preferred embodiments when read in conjunction with the accompanying drawings in which.

DESCRIPTION OF THE PREFERRED EMBODIMENT

A pin reforming tool in accordance with embodiments of the present invention is made up of multiple machined parts assembled into one complete tool that addresses reforming backplane connector pins in a rod control system such as, for example, without limitation, the Westinghouse Rod Control System.

Figure 1A:
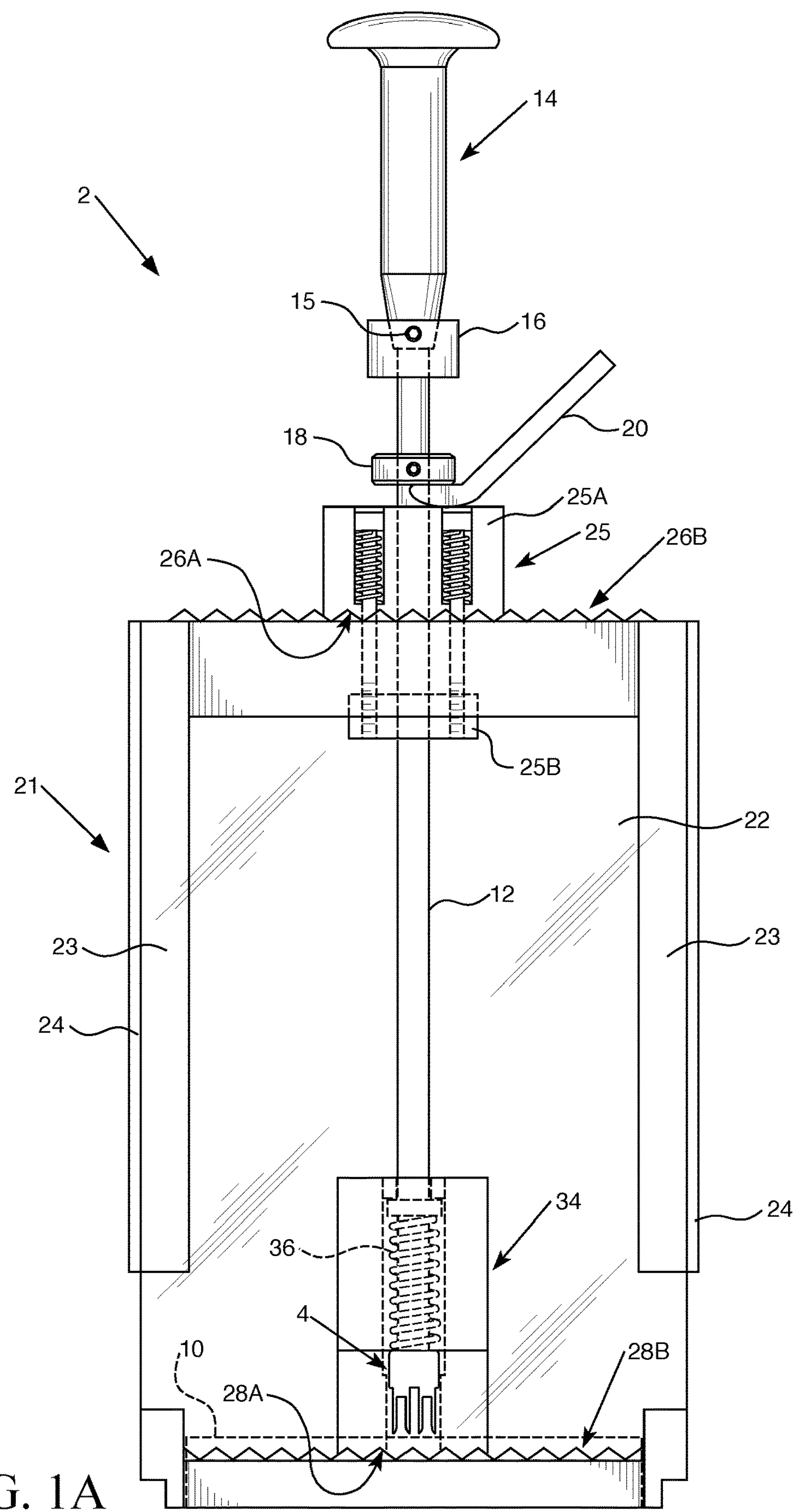
FIG. 1A is a front schematic view of a pin reforming tool in accordance with an example embodiment of the present invention.
Figure 1B:
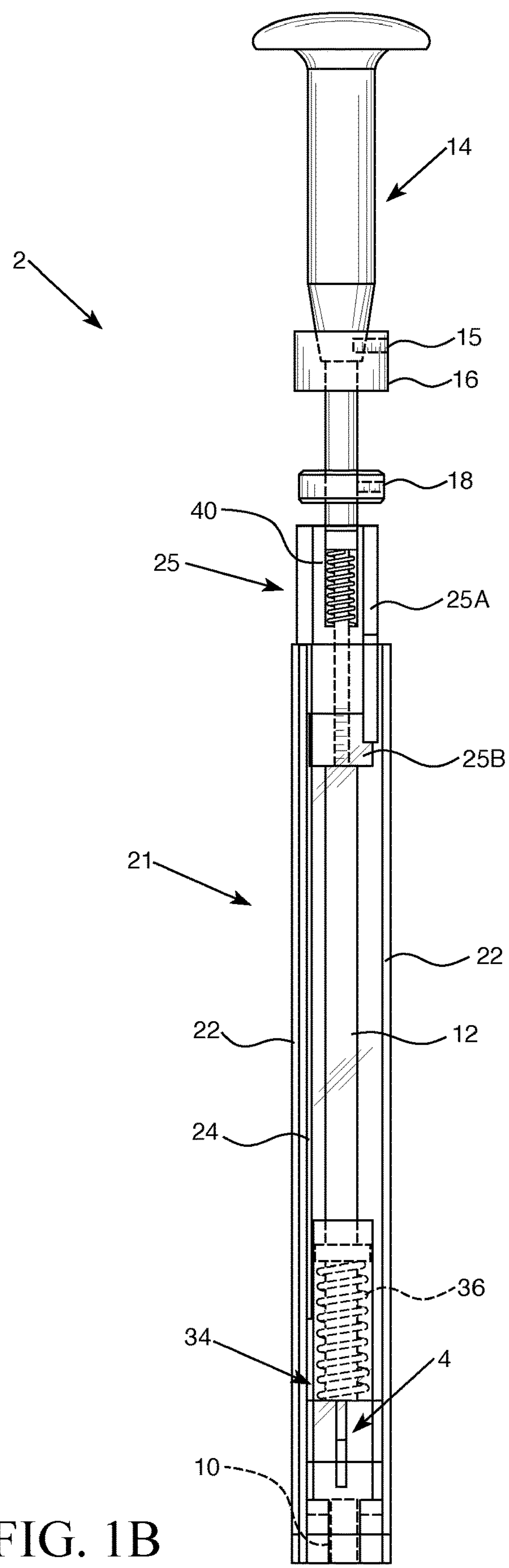
FIG. 1B is a side schematic view of the pin reforming tool of FIG. 1A.
Figure 2A:
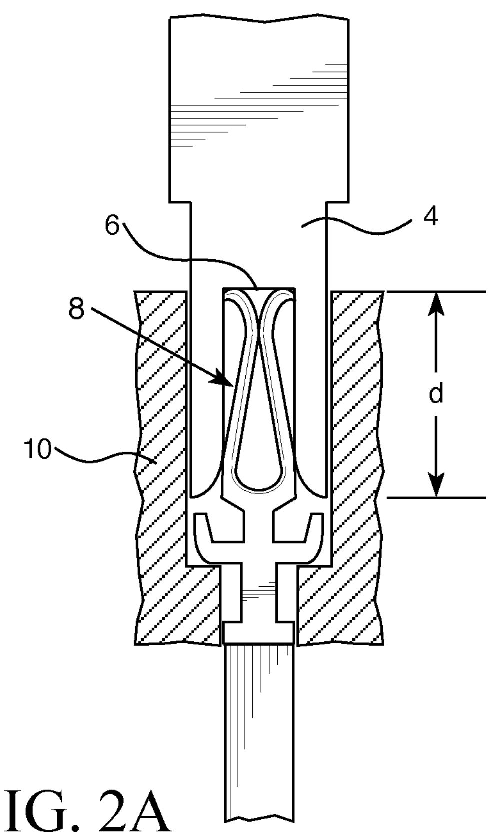
FIG. 2A is an enlarged schematic view of a single pin die in accordance with an example embodiment of the present invention that may be employed in a pin reforming tool such as shown in FIG. 1 shown engaged with one pin within a portion of a connector housing.
Figure 2B:
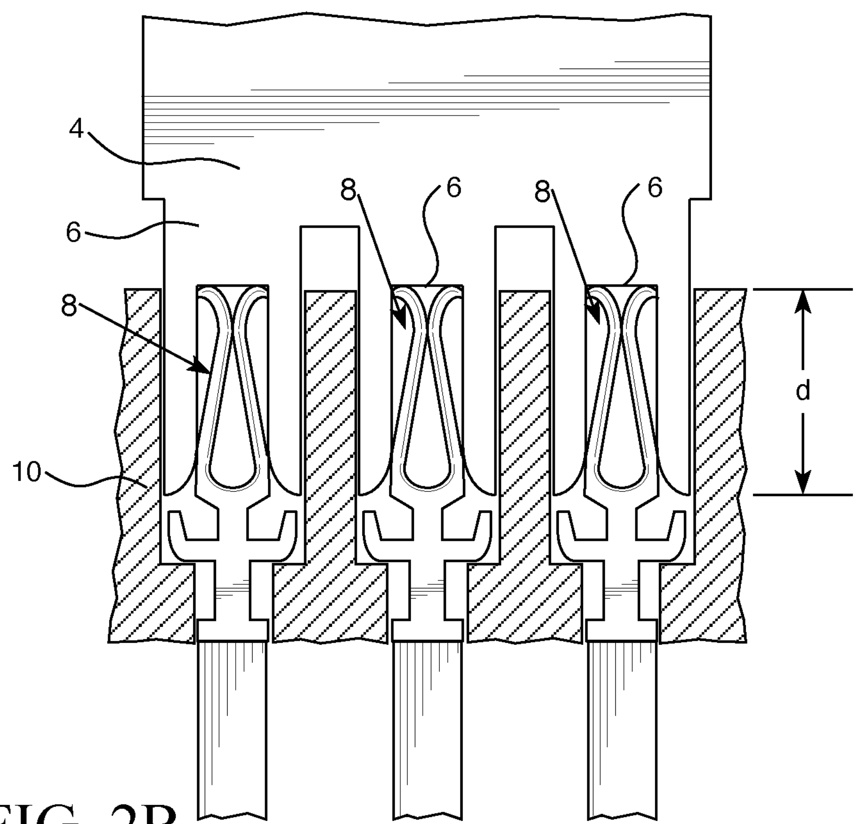
FIG. 2B is an enlarged schematic view of a three pin die in accordance with an example embodiment of the present invention that may be employed in a reforming tool such as shown in FIG. 1 shown engaged with three pins within a portion of a connector housing.

A pin reforming tool 2 in accordance with one example embodiment of the present invention in shown in FIGS. 1A and 1B, with more detailed views of various portions/components thereof shown in FIGS. 2A, 2B, 3A, 3B and 3-6. The pin reforming tool 2 includes a die 4 having one or more slots 6 defined therein that are each sized and configured to engage and reform a respective connector pin 8 at a given time, such as shown in the detailed views of FIGS. 2A and 2B. Although FIGS. 2A and 2B, respectively, show examples in which only one connector pin 8, and three connector pins 8 are reformed at a given time, it is to be appreciated that while such arrangements have been found to be preferable for particular applications, dies 4 having other quantities of slots 6 for reforming other quantities of pins 8 may be employed without varying from the scope of the present concept. As can be appreciated from the views of FIGS. 2A and 2B, the die 4 is designed to engage along the sides of the selected backplane connector pin(s) 8 between the each pin and the connector housing 10, and the die 4 is operable to enter the connector housing 10 to a predetermined depth d, resulting in reformation of the pin(s) 8.

Referring once again to FIGS. 1A and 1B, in the pin forming tool 2, the die 4 is connected to an extension rod 12, which is connected to a force application unit 14, which in the example embodiment illustrated in FIGS. 1A and 1B is a center punch, for applying a predictable/controlled reforming force to the die 4. In the example shown, center punch is a spring loaded automatic center punch of the type commonly used to create a starting point for a drill bit, but has had its central shaft changed from one with a point to one with a threaded end that can engage and be coupled to an end of the extension rod 12. The center punch is adjustable and is set to a predetermined tension and locked down via a set screw 15 and collar 16 arrangement to provide the desired force on the die 4. The center punch supplies a consistent force enabling the reformation of the selected pin(s) 8. The spring on the center punch resets itself after the force on the center punch is removed. A collar 18 is attached to the extension rod 12 just below the center punch, which assists in extraction of the die 4 with a small lever device 20, as discussed further below.

Continuing to refer to FIGS. 1A and 1B, tool 2 includes a tool housing 21 which is designed to locate itself around a portion of the connector housing 10 (shown in hidden line in FIGS. 1A and 1B) of the backplane connector of the rod control system once installed in the electronics cabinet and serve generally as a frame for aligning the die 4 with the desired pin(s) 8 within the connector housing 10 needing reforming, while also ensuring proper alignment of the extension rod 12 and force application unit 14 with such pin(s) 8. In the illustrated example embodiment, the tool housing 21 is made of clear polycarbonate sheets 22 on the top and bottom sides (front and back sides as the tool 2 as shown in FIG. 1A and left and right sides as shown in FIG. 1B) with spacers 23 (e.g., formed from a poly carbonate or other suitable material) and card guide strips 24 (e.g., formed from a plastic or other suitable material) sandwiched between the sheets 22. The spacers 23 and the card guide strips 24 are sized and configured to slide within electrical circuit card guides of a rack, thus aligning the die 4 with a particular row of pins 8.

Figure 4:
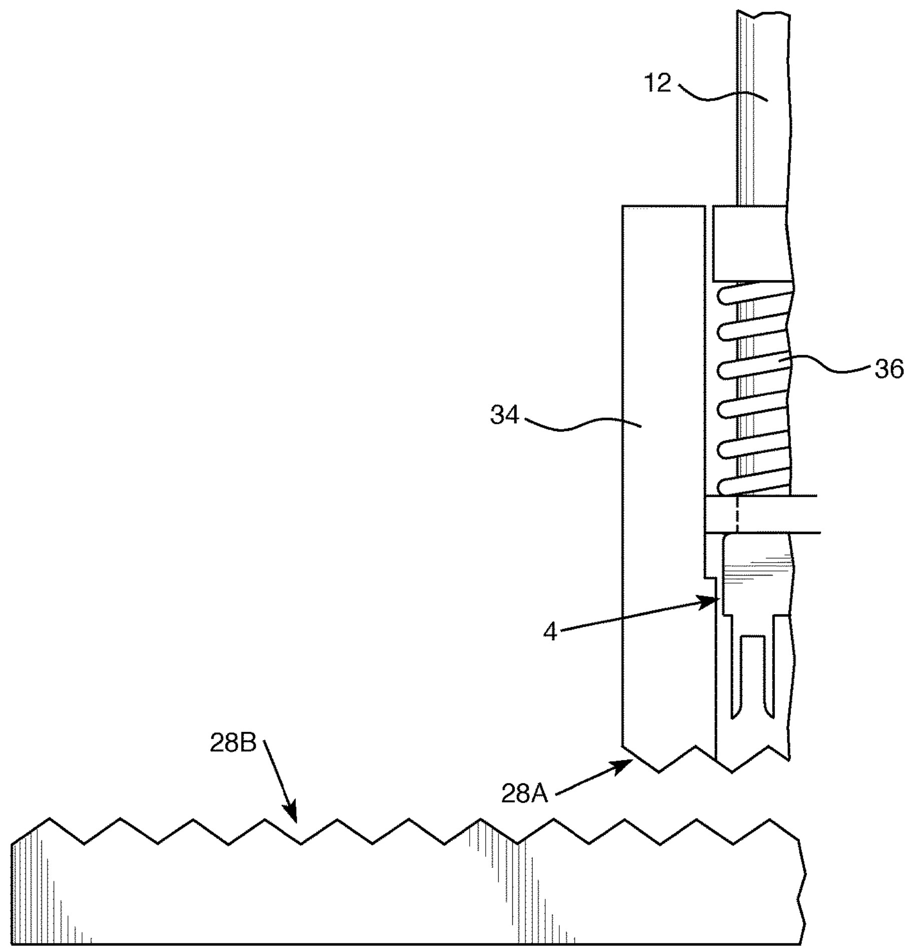
FIG. 4 is an enlarged schematic front view of a portion of the lower zig zag alignment guide of FIG. 1A with a portion of the reforming die assembly shown above it.
Figure 5:
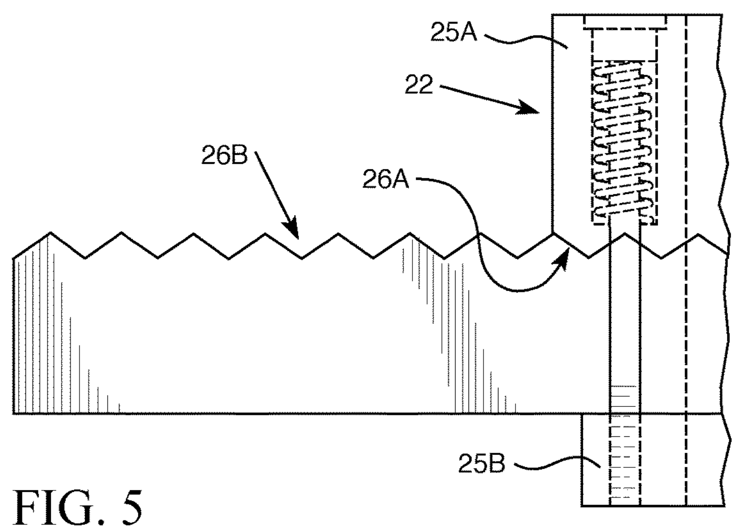
FIG. 5 is an enlarged schematic front view of a portion of the upper zig zag alignment guide and slide block of FIG. 1A.

The reforming die 4 (as well as the connected extension rod 12 and the force application unit 14) is moveable from one pin (or group of pins) to another pin (or group of pins) 8 within the particular row of the connector housing 10 via a spring-loaded slide block 25 which is selectively slidable along (i.e., left to right in FIG. 1A) a top of the tool housing 21 and through which the extension rod 12 freely axially slides. In the example illustrated in FIGS. 1A, 1B and 5, the slide block 25 includes an upper portion 25A that can be pulled outward (i.e., upward in the view shown in FIGS. 1A and 1B) against a spring tension from a lower portion 25B such that the slide block 25 may be moved laterally (i.e., left or right in FIG. 1A) to the next pin (or group of pins) to be reformed when the upper portion 25A is pulled outward. As shown in FIG. 1A, the upper portion 25A of the slide block 25 incorporates a zig zag tooth design locator 26A which interacts with a correspondingly shaped zig zag tooth design locator 26B located on the top portion of the tool hosing 21 to assist in precise alignment, and securement of the reforming die 4 with the pin(s) 8 to be reformed within the connector housing 10. As shown in FIGS. 1A, 1B and 4, a second, lower zig zag tooth design locator 28A is provided on a bottom side of a die housing 34 which is positioned about die 4. The lower zig zag tooth design locator 28A similarly interacts with another correspondingly shaped lower zig zag tooth design locator 28B provided near a bottom portion of the tool housing 21 to ensure corresponding alignment at the base of the tool 2 with the top of the tool 2. In order to allow for fine adjustment to the alignment of the die 4 provided by the interaction of the lower locators 28A and 28B, the correspondingly shaped lower zig zag tooth design locator 28B may be selectively coupled to the tool housing 21 via one or more setscrews which provide for fine adjustment of the lateral positioning of the locator 28 with respect to the tool housing 21, and thus fine adjustment of the lateral positioning of the die 4 with respect to the pin(s) 8 within the connector housing 10 engaged by the tool housing 21. A spring 36 may be provided in die housing 34 which provides a force on the extension rod 12 opposite the force application unit 14 so as to generally keep die 4 retracted into die housing 34 when force is not being applied via the force application unit 14.

In order to assist with aligning the die 4 with the desired pin or pins 8, slide block 25 and the adjacent portion of tool housing 21 may be provided with corresponding indicia that provide an indication as to with what pin(s) 8 the die 4 is aligned. In one example embodiment such indicia includes an indicator line provided on slide block 25 and a set of numerals positioned along near the top of tool housing 21, such that the numeral in line with the indicator line indicates the number(s) of the pin(s) with which the die 4 is aligned for reforming. A similar arrangement may also be employed on die housing 34 and the adjacent portion of tool housing 21.

The die housing 34 that resides in the base of the tool is designed such that the die 4 is offset so as to align with either the even pin row or the odd pin row of the backplane connector. This offset is also carried through on the slide block 25 which incorporates an offset piece 40 machined for either odd or even pin rows. The die assemblies and offset pieces are interchangeable and easily replaceable so as to allow for the arrangement to be used with either odd or even pin rows.

Figure 3A:
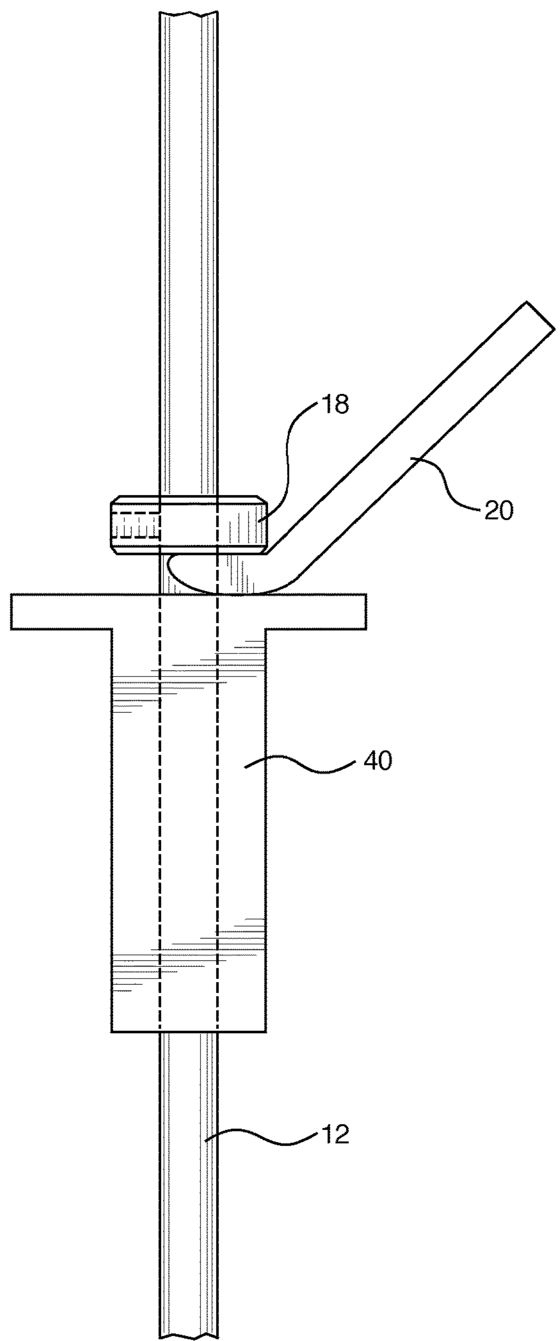
FIG. 3A is an enlarged front schematic view of the release lever and collar of FIG. 1A.
Figure 3B:
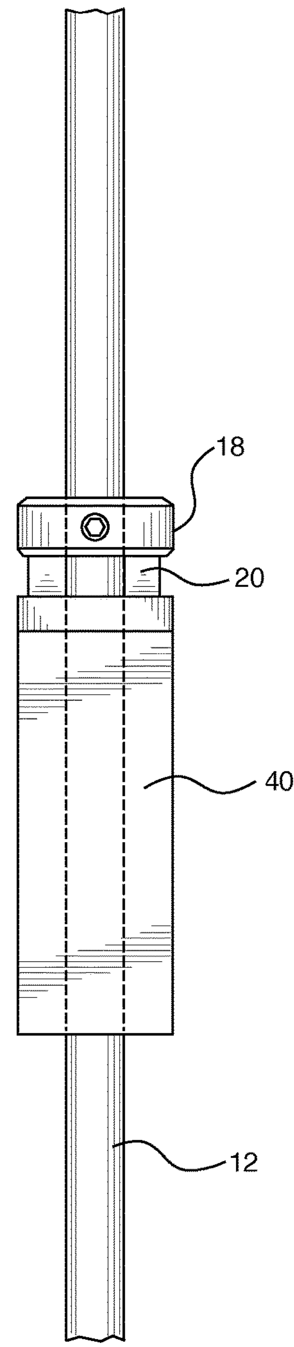
FIG. 3B is a side view of the release lever and collar shown of FIG. 2A.

From the foregoing it is thus to be appreciated that the example illustrated electrical pin reforming tool 2 discussed herein has a housing 21 that is made from a clear polycarbonate, which facilitates viewing during the reforming process. When installed in the card cage, the tool housing 21 of the pin reforming tool 2 captures a portion of the connector housing 10 of the selected backplane connector on all sides using it as an alignment aid. The tool 2 uses a unique zig zag designed alignment guide at the bottom and top of the tool to ensure precise alignment of the reforming die 4. The reforming die 4 design captures the subject pin(s) 8 and allows sufficient tool penetration into the connector housing 10 to reform the pin(s) 8 to manufacturer specifications. A center punch set to a predefined value is used to ensure consistent force is applied each time the reforming process is initiated. The die 4 is readily retractable after reforming of the pin(s) 8 via light prying with the small lever device 20 between the slide block 25 and the collar 18 on the extension rod 12 (such as generally shown in FIG. 3A).

While specific embodiments of the invention have been described in detail, it will be appreciated by those skilled in the art that various modifications and alternatives to those details could be developed in light of the overall teachings of the disclosure. Accordingly, the particular embodiments disclosed are meant to be illustrative only and not limiting as to the scope of the invention which is to be given the full breadth of the appended claims and any and all equivalents thereof

What is claimed is:

1. An electrical connector pin reforming tool comprising:

a pin reforming die configured to at least partially engage a pin of an electrical connector and substantially reform the pin;

a force applicator structured to provide a force of a preselected magnitude;

an extension rod connected at one end to the pin reforming die and at another, opposite end to the force applicator, wherein the extension rod is positioned and structured to convey a predetermined force from the force applicator to the pin reforming die, wherein the force applicator comprises an automatic center punch; and a tool housing structured to engage a connector housing having a plurality of pins positioned therein, and wherein the pin reforming die assembly, the extension rod, and the force applicator are movable from one pin or group of pins of the plurality of pins to another pin or group of pins of the plurality of pins by a movement of a spring-loaded slide block that slides on an upper portion of the tool housing, with the extension rod passing through the spring-loaded slide block.

2. The electrical connector pin reforming tool of claim 1, wherein the pin reforming die is structured to reform only a single pin at a time.

3. The electrical connector pin reforming tool of claim 1, wherein the pin reforming die is structured to reform more than one pin at a time.

4. The electrical connector pin reforming tool of claim 1, wherein the pin reforming die is structured to reform three pins at a time.

5. The electrical connector pin reforming tool of claim 1, wherein the magnitude of the preselected force is adjustable.

6. The electrical connector pin reforming tool of claim 5, wherein the magnitude of the preselected force is adjustable via a set screw on the center punch.

7. The electrical connector reforming tool of claim 1, including an underside surface on the spring-loaded slide block with a geometry corresponding to that of an upper surface on an upper portion of the tool housing, wherein the corresponding geometry is for aligning the pin reforming die over the pin or group of pins to be reformed.

8. The electrical connector reforming tool of claim 7, wherein the corresponding geometry for aligning the pin reforming die comprises a wavy geometry on the underside surface on the spring-loaded slide block and a correspondingly shaped wavy geometry on the upper surface on the upper portion of the tool housing.

9. The electrical connector reforming tool of claim 8, wherein the corresponding geometry for aligning the pin reforming die further comprises a wavy underside surface of a die housing positioned about the pin reforming die and a correspondingly shaped upper surface on a lower portion of the tool housing.

10. The electrical connector reforming tool of claim 1, wherein a portion of the tool housing is formed from a substantially clear polycarbonate.

11. The electrical connector reforming tool of claim 1, wherein the pin reforming die is structured to engage opposite sides of the pin.

12. The electrical connector reforming tool of claim 1, wherein the automatic center punch is spring-loaded.

13. An electrical connector pin reforming tool comprising:

a pin reforming die configured to at least partially engage a pin of an electrical connector and substantially reform the pin;

a force applicator structured to provide a force of a preselected magnitude; and an extension rod connected at one end to the pin reforming die and at another, opposite end to the force applicator, wherein the extension rod is positioned and structured to convey a predetermined force from the force applicator to the pin reforming die; and a collar coupled on the extension rod above, and spaced from, a spring-loaded slide block and below an automatic center punch, and a release lever sandwiched between the collar and the spring-loaded slide block, wherein the release lever is configured to leverage the collar away from the spring-loaded slide block to release the preselected force.

* * * * *